US012564088B2

(12) United States Patent
Harada

(10) Patent No.: US 12,564,088 B2
(45) Date of Patent: Feb. 24, 2026

(54) SEMICONDUCTOR DEVICE

(71) Applicants:Kabushiki Kaisha Toshiba, Tokyo (JP); Toshiba Electronic Devices & Storage Corporation, Tokyo (JP)

(72) Inventor: Shigeru Harada, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 756 days.

(21) Appl. No.: 17/682,707

(22) Filed: Feb. 28, 2022

(65) Prior Publication Data

US 2023/0090448 A1 Mar. 23, 2023

(30) Foreign Application Priority Data

Sep. 17, 2021 (JP) ................................. 2021-152689

(51) Int. Cl.
H01L 23/31 (2006.01)
H01L 21/56 (2006.01)
(Continued)

(52) U.S. Cl.
CPC ........ H01L 23/3107 (2013.01); H01L 21/561 (2013.01); H01L 21/565 (2013.01);
(Continued)

(58) Field of Classification Search
CPC . H01L 23/3107; H01L 21/561; H01L 21/565; H01L 23/295; H01L 23/49513; H01L 24/45; H01L 24/48; H01L 2224/45124;

H01L 2224/45147; H01L 2224/48245; H01L 23/29; H01L 23/49562; H01L 2224/48091; H01L 2224/48247; H01L 2924/181; H01L 2924/1815;
(Continued)

(56) References Cited

U.S. PATENT DOCUMENTS 4,933,744 A * 6/1990 Segawa .................... H01G 2/12
174/521
4,946,633 A * 8/1990 Saeki .................... H01L 21/565
264/40.5
(Continued)

FOREIGN PATENT DOCUMENTS

JP 51-020967 A 2/1976
JP H011-13346 U 7/1989
(Continued)

*Primary Examiner* — Marlon T Fletcher
*Assistant Examiner* — Samuel Jonathan Smith
(74) *Attorney, Agent, or Firm* — Knobbe, Martens, Olson & Bear, LLP

(57) ABSTRACT

A semiconductor device of embodiments includes: a die pad; a semiconductor chip fixed on the die pad; and a sealing resin covering the semiconductor chip and at least a part of the die pad. The sealing resin has a first protruding portion provided on one side surface and a second protruding portion provided on another side surface. The cross-sectional area of the first protruding portion is equal to or more than 10% of the maximum cross-sectional area of the sealing resin. The cross-sectional area of the second protruding portion is equal to or more than 10%; of the maximum cross-sectional area. The maximum cross-sectional area is equal to or more than 6 mm$^2$.

12 Claims, 18 Drawing Sheets

FIRST DIRECTION
AA'
CROSS SECTION

(51) Int. Cl.

| | | |
|---|---|---|
| *H01L 23/00* | (2006.01) | |
| *H01L 23/29* | (2006.01) | |
| *H01L 23/495* | (2006.01) | |

(52) U.S. Cl.

CPC ...... *H01L 23/295* (2013.01); *H01L 23/49513* (2013.01); *H01L 24/45* (2013.01); *H01L 24/48* (2013.01); *H01L 2224/45124* (2013.01); *H01L 2224/45147* (2013.01); *H01L 2224/48245* (2013.01)

(58) Field of Classification Search

CPC ........ B29C 2045/2709; B29C 45/2708; B29C 2045/2712; B29C 45/53; B29K 2063/00; B29K 2105/16; B29L 2031/3481

See application file for complete search history.

(56) References Cited

U.S. PATENT DOCUMENTS

| | | | | |
|---|---|---|---|---|
| 6,015,280 A | * | 1/2000 | Blish, II | B29C 45/2701 |
| | | | | 264/272.17 |
| 6,177,724 B1 | * | 1/2001 | Sawai | H01L 23/3128 |
| | | | | 257/730 |

| | | | | |
|---|---|---|---|---|
| 2001/0011598 A1 | * | 8/2001 | Kobayashi | H01L 23/49562 |
| | | | | 174/532 |
| 2004/0061206 A1 | * | 4/2004 | Son | H01L 23/49562 |
| | | | | 257/E23.044 |
| 2007/0045792 A1 | * | 3/2007 | Fuchinoue | H01L 23/49541 |
| | | | | 257/676 |
| 2008/0119065 A1 | * | 5/2008 | Takakusaki | H01L 23/49575 |
| | | | | 439/74 |
| 2010/0219517 A1 | | 9/2010 | Yoshiba et al. | |
| 2022/0115246 A1 | * | 4/2022 | Higashi | H01L 25/50 |
| 2022/0293434 A1 | | 9/2022 | Iwai et al. | |

FOREIGN PATENT DOCUMENTS

| | | | | | |
|---|---|---|---|---|---|
| JP | 03-259554 A | | 11/1991 | | |
| JP | H06-252184 A | | 9/1994 | | |
| JP | H06-260518 A | | 9/1994 | | |
| JP | 07-254624 A | | 10/1995 | | |
| JP | H08-11166 A | | 1/1996 | | |
| JP | H053267 A | * | 1/1996 | | |
| JP | 2001127212 A | * | 5/2001 | | |
| JP | 2001156239 A | * | 6/2001 | | |
| JP | 2006344898 A | * | 12/2006 | ............ | H01L 24/97 |
| JP | 2010-109314 A | | 5/2010 | | |
| JP | 2014-132688 A | | 7/2014 | | |
| WO | WO 2021/070677 A1 | | 4/2021 | | |

* cited by examiner

FIRST DIRECTION

THIRD DIRECTION

100

FIRST DIRECTION

AA'
CROSS SECTION

SECOND DIRECTION

100

THIRD DIRECTION

BB'
CROSS SECTION

SECOND DIRECTION

100

THIRD DIRECTION

SECOND DIRECTION

CC'
CROSS SECTION

18a tf sf4 sf3 d1 bf

100

THIRD DIRECTION

SECOND DIRECTION

DD'
CROSS SECTION

18b tf sf4 sf3 d2 bf

100

THIRD DIRECTION

SECOND DIRECTION

EE'
CROSS SECTION

18 tf sf4 sf3 d3 bf

100

FF' CROSS SECTION

36

31

32

GG' CROSS SECTION

34

31

32

HH'
CROSS SECTION

31

38

32

II'
CROSS SECTION

31

38

32

FIRST DIRECTION

900

FIRST DIRECTION

AA'
CROSS SECTION

900

THIRD DIRECTION

BB'
CROSS SECTION

900

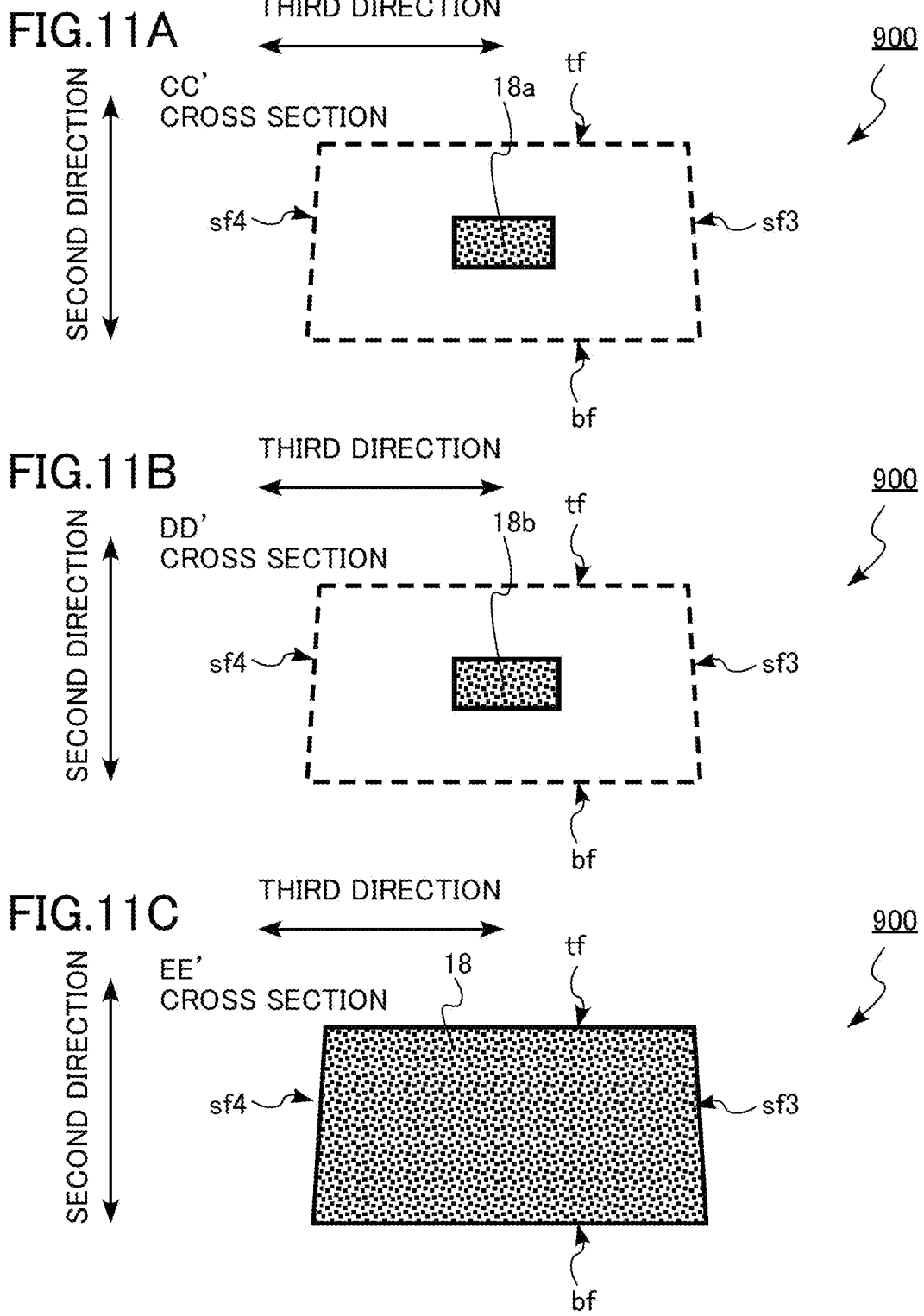

THIRD DIRECTION

SECOND DIRECTION

200

18a tf sf4 sf3 bf

THIRD DIRECTION

SECOND DIRECTION

200

18b tf sf4 sf3 bf

THIRD DIRECTION

SECOND DIRECTION

200

18 tf sf4 sf3 bf

FIRST DIRECTION

FIRST DIRECTION

AA'
CROSS SECTION

THIRD DIRECTION

BB'
CROSS SECTION

FIRST DIRECTION

THIRD DIRECTION

400

FIRST DIRECTION

SECOND DIRECTION

AA'
CROSS SECTION

400

THIRD DIRECTION

SECOND DIRECTION

BB'
CROSS SECTION

400

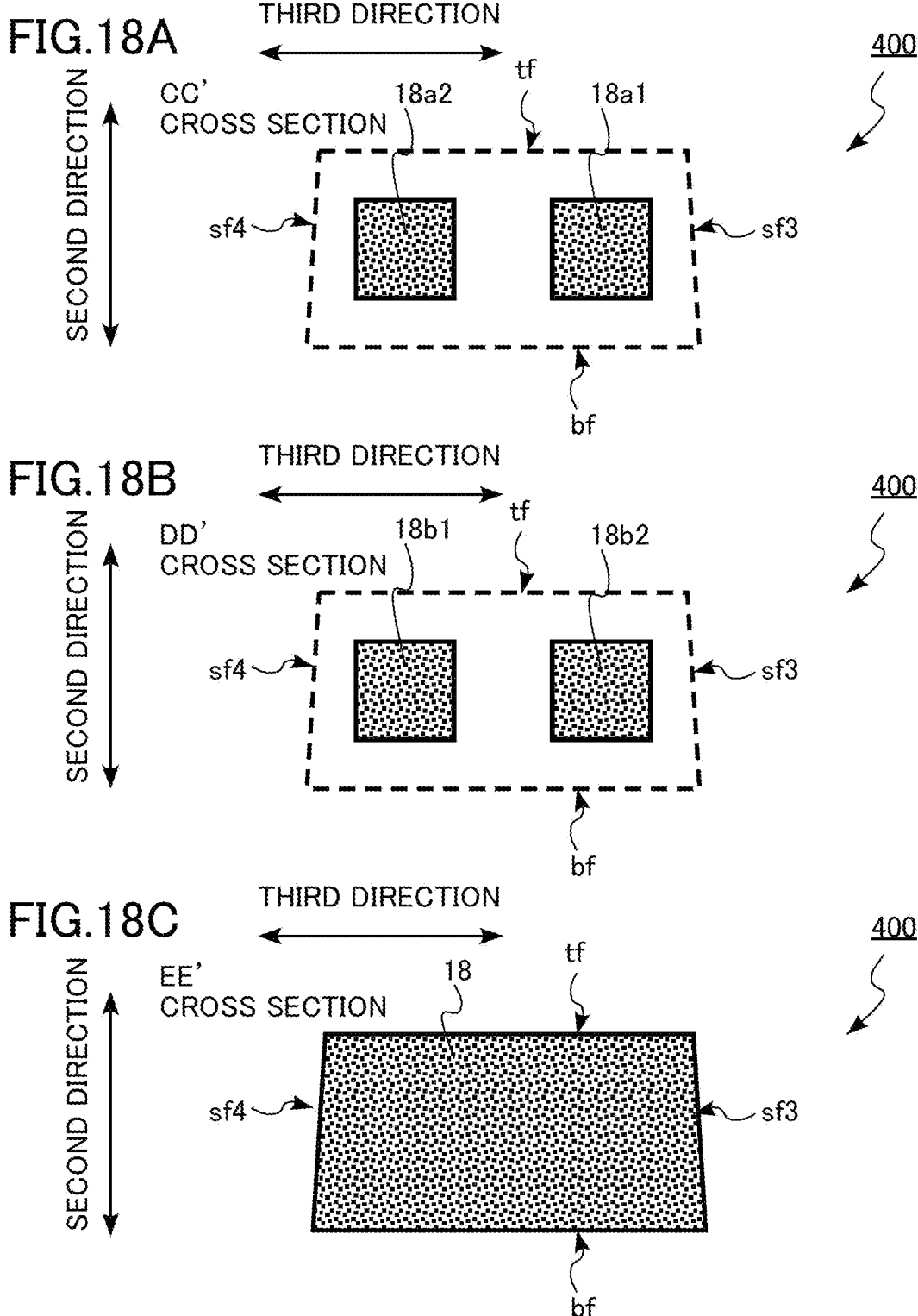

SEMICONDUCTOR DEVICE

CROSS-REFERENCE TO RELATED APPLICATION

This application is based upon and claims the benefit of priority from Japanese Patent Application No. 2021-152689, filed on Sep. 17, 2021, the entire contents of which are incorporated herein by reference.

FIELD

Embodiments described herein relate generally to a semiconductor device.

BACKGROUND

There is a transfer molding method as a resin sealing technology for semiconductors. In the transfer molding method, a semiconductor package is manufactured by filling a cavity, in which a semiconductor chip is provided, with a resin melted in a plunger and curing the resin. For example, by filling a plurality of cavities connected to each other by a through gate with a molten resin, the productivity of a semiconductor package is improved.

BRIEF DESCRIPTION OF THE DRAWINGS

FIGS. 11A, 11B, and 11C are schematic cross-sectional views of the comparative example of the semiconductor device of the first embodiment;

FIGS. 18A, 18B, and 18C are schematic cross-sectional views of the semiconductor device of the fourth embodiment.

DETAILED DESCRIPTION

Figures 1A, 1B, 1C:
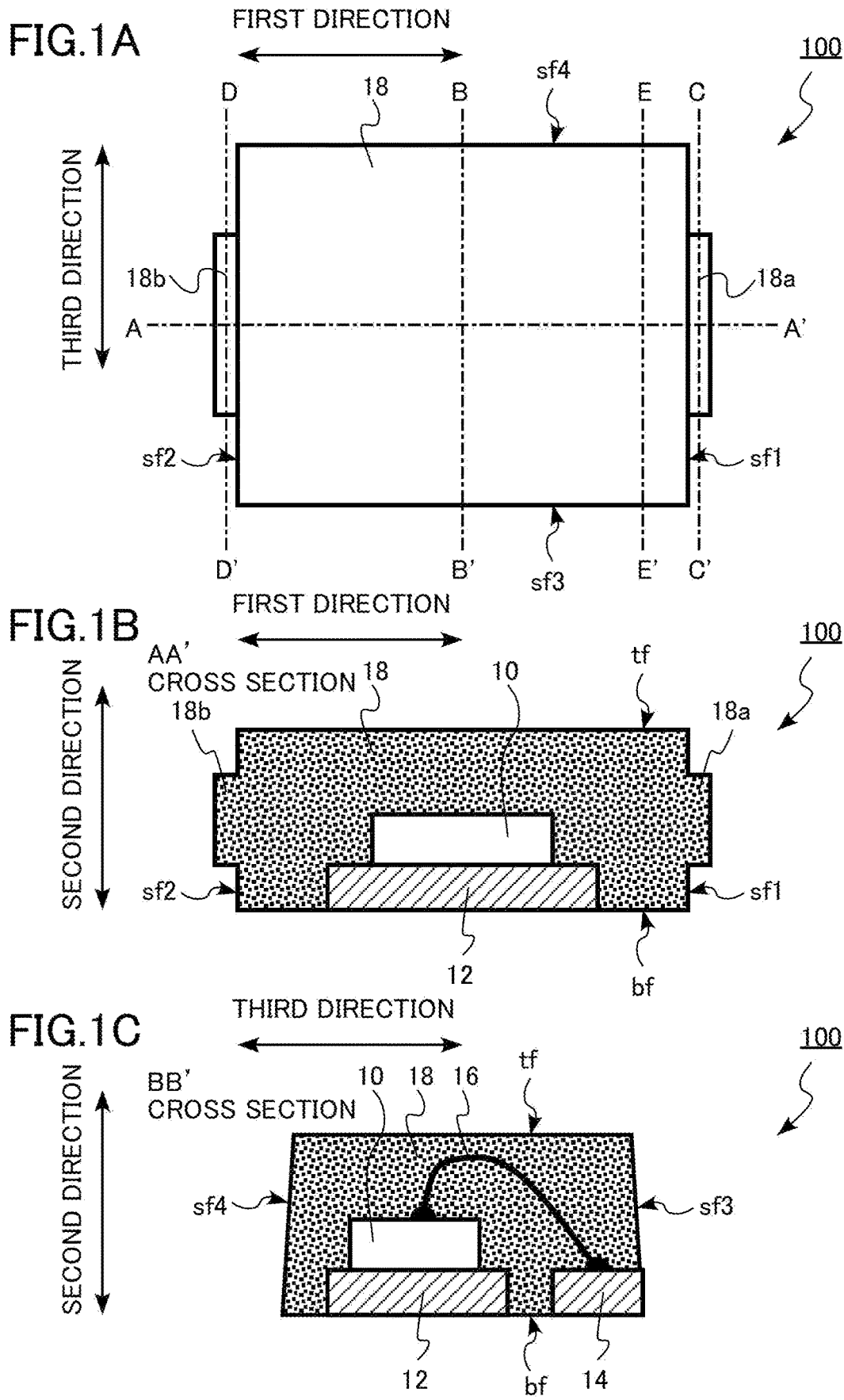
FIGS. 1A, 1B, and 1C are schematic diagrams of a semiconductor device of a first embodiment.

A semiconductor device of embodiments includes: a die pad; a semiconductor chip fixed on the die pad; and a sealing resin covering the semiconductor chip and at least a part of the die pad, the sealing resin including a first side surface, a second side surface, a bottom surface, and a top surface, the second side surface facing the first side surface in a first direction, the top surface facing the bottom surface in a second direction, the sealing resin including at least one first protruding portion provided on a side of the first side surface and at least one second protruding portion provided on a side of the second side surface, a cross-sectional area of the at least one first protruding portion on a cross section perpendicular to the first direction being equal to or more than 10% of a maximum cross-sectional area of the sealing resin on a cross section perpendicular to the first direction, a cross-sectional area of the at least one second protruding portion on a cross section perpendicular to the first direction being equal to or more than 10% of the maximum cross-sectional area of the sealing resin, and the maximum cross-sectional area being equal to or more than 6 mm$^2$.

Hereinafter, embodiments will be described with reference to the diagrams. In the following description, the same or similar members and the like may be denoted by the same reference numerals, and the description of the members and the like once described may be omitted as appropriate.

In this specification, the length and the like of the members configuring the semiconductor device can be calculated from, for example, an image of a scanning electron microscope (SEM).

First Embodiment

A semiconductor device of a first embodiment includes: a die pad; a semiconductor chip fixed on the die pad; and a sealing resin covering the semiconductor chip and at least a part of the die pad. The sealing resin has a first side surface and a second side surface facing the first side surface in a first direction and has a bottom surface and a top surface facing the bottom surface in a second direction. The sealing resin has at least one first protruding portion provided on a side of the first side surface and at least one second protruding portion provided on a side of the second side surface. A cross-sectional area of the at least one first protruding portion on a cross section perpendicular to the first direction is equal to or more than 10% of a maximum cross-sectional area of the sealing resin on a cross section perpendicular to the first direction. A cross-sectional area of the at least one second protruding portion on a cross section perpendicular to the first direction is equal to or more than 10% of the maximum cross-sectional area of the sealing resin. The maximum cross-sectional area is equal to or more than 6 mm$^2$.

The semiconductor device of the first embodiment is a semiconductor package 100 in which a semiconductor chip is resin-sealed.

FIGS. 1A, 1B, and 1C are schematic diagrams of the semiconductor device of the first embodiment. FIG. 1A is a top view. FIG. 1B is a cross-sectional view. FIG. 1B is a cross-sectional view taken along the line AA' of FIG. 1A. FIG. 1C is a cross-sectional view. FIG. 1C is a cross-sectional view taken along the line BB' of FIG. 1A.

Figures 2A, 2B, 2C:
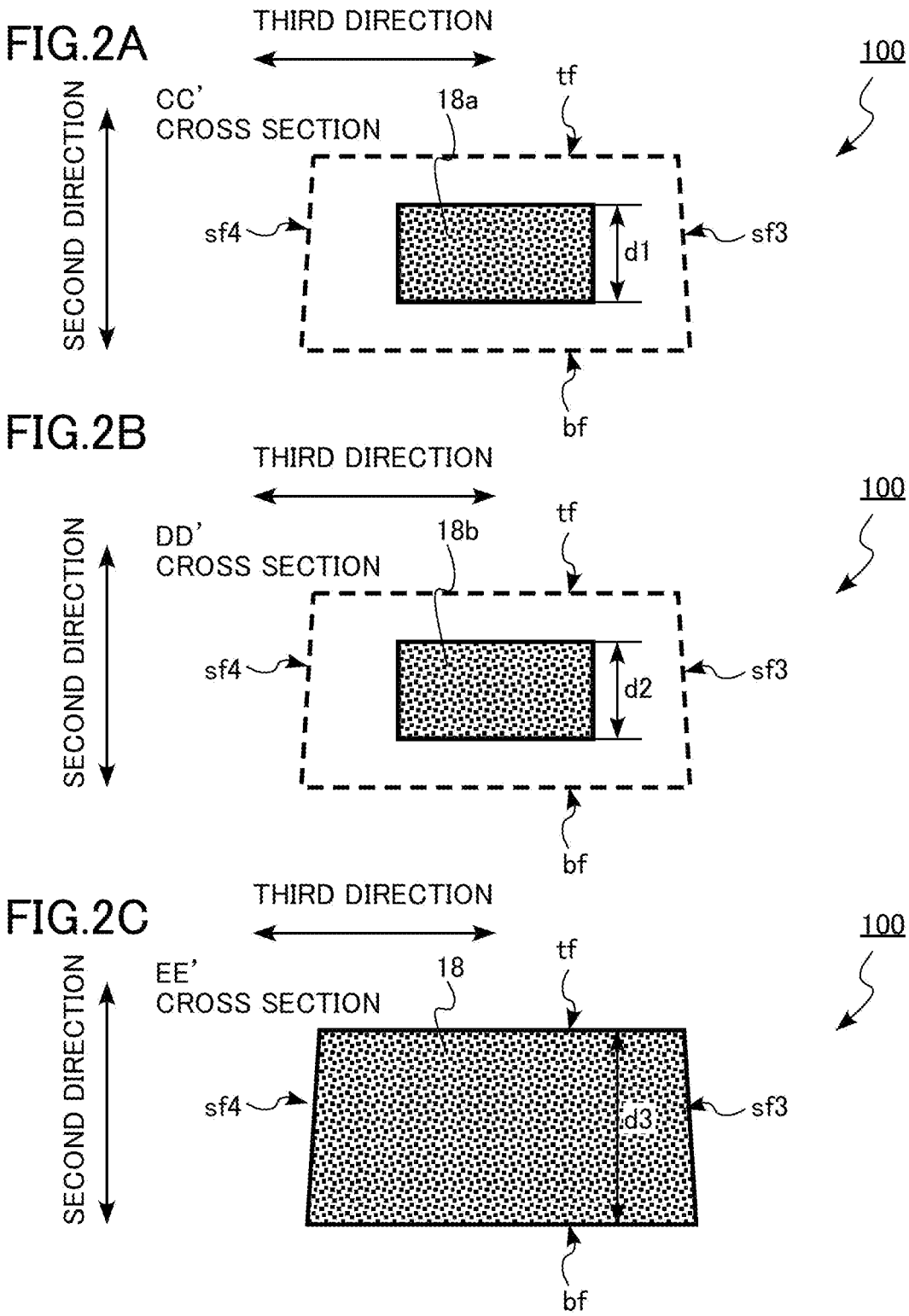
FIGS. 2A, 2B, and 2C are schematic cross-sectional views of the semiconductor device of the first embodiment.

FIGS. 2A, 2B, and 2C are schematic cross-sectional views of the semiconductor device of the first embodiment. FIG. 2A is a cross-sectional view taken along the line CC' of FIG. 1A. FIG. 2B is a cross-sectional view taken along the line DD' of FIG. 1A. FIG. 2C is a cross-sectional view taken along the line EE' of FIG. 1A.

The semiconductor package 100 includes a semiconductor chip 10, a die pad 12, a lead portion 14, a bonding wire 16, and a sealing resin 18.

The sealing resin 18 has a first side surface sf1, a second side surface sf2, a third side surface sf3, a fourth side surface sf4, a bottom surface bf, and a top surface tf. The sealing resin 18 has a first protruding portion 18a and a second protruding portion 18b.

Hereinafter, the direction from the first side surface sf1 to the second side surface sf2 is defined as a first direction, the direction from the third side surface sf3 to the fourth side surface sf4 is defined as a third direction, and the direction from the bottom surface bf to the top surface tf is defined as a second direction.

The semiconductor chip 10 is, for example, a power semiconductor device. The semiconductor chip 10 is, for example, a metal oxide semiconductor field effect transistor (MOSFET), an insulated gate bipolar transistor (IGBT), or a diode.

The semiconductor chip 10 is fixed on the die pad 12. The semiconductor chip 10 is fixed to the surface of the die pad 12 by using, for example, solder.

The die pad 12 has, for example, a rectangular shape. The die pad 12 is a metal. The die pad 12 is, for example, copper or a copper alloy.

The thickness of the die pad 12 is, for example, 0.5 mm.

The lead portion 14 is provided in the third direction of the die pad 12. The lead portion 14 is a metal. The lead portion 14 is, for example, copper or a copper alloy. The lead portion 14 is formed of, for example, the same material as the die pad 12.

The thickness of the lead portion 14 is, for example, 0.5 mm.

The bonding wire 16 connects the semiconductor chip 10 and the lead portion 14 to each other. The bonding wire 16 electrically connects the semiconductor chip 10 and the lead portion 14 to each other.

The bonding wire 16 is a metal wire. The bonding wire 16 contains, for example, copper (Cu) or aluminum (Al). The bonding wire 16 is, for example, a copper wire or an aluminum wire.

The sealing resin 18 covers the semiconductor chip 10 and the bonding wire 16. The sealing resin 18 covers at least a part of the die pad 12. The sealing resin 18 covers at least a part of the lead portion 14. The sealing resin 18 has a function of protecting the semiconductor chip 10 and the bonding wire 16.

The sealing resin 18 contains a resin. The sealing resin 18 contains, for example, an epoxy resin.

The sealing resin 18 has the first side surface sf1, the second side surface sf2, the third side surface sf3, the fourth side surface sf4, the bottom surface bf, and the top surface tf. The second side surface sf2 faces the first side surface sf1 in the first direction. The fourth side surface sf4 faces the third side surface sf3 in the third direction. The top surface tf faces the bottom surface bf in the second direction.

The sealing resin 18 has the first protruding portion 18a and the second protruding portion 18b.

The first protruding portion 18a is provided on the first side surface sf1 side of the sealing resin 18. The first protruding portion 18a protrudes in the first direction.

The second protruding portion 18b is provided on the second side surface sf2 side of the sealing resin 18. The second protruding portion 18b protrudes in the first direction.

The cross-sectional area of the first protruding portion 18a on the cross section perpendicular to the first direction is equal to or more than 10% and equal to or less than 50% of the maximum cross-sectional area of the sealing resin 18 on the cross section perpendicular to the first direction. For example, the area of the cross section of the sealing resin 18 shown in FIG. 2C is the maximum cross-sectional area of the sealing resin 18. For example, the area of the cross section of the first protruding portion 18a shown in FIG. 2A is equal to or more than 10% and equal to or less than 50% of the area of the cross section of the sealing resin 18 shown in FIG. 2C.

In addition, the cross-sectional area of the second protruding portion 18b on the cross section perpendicular to the first direction is equal to or more than 10% and equal to or less than 50% of the maximum cross-sectional area of the sealing resin 18 on the cross section perpendicular to the first direction. For example, the area of the cross section of the second protruding portion 18b shown in FIG. 2B is equal to or more than 10% and equal to or less than 50% of the area of the cross section of the sealing resin 18 shown in FIG. 2C.

The maximum cross-sectional area of the sealing resin 18 is equal to or more than 6 mm$^2$.

The length (d1 in FIG. 2A) of the first protruding portion 18a in the second direction is equal to or more than 100 µm and equal to or less than 1 mm, for example. In addition, the length (d2 in FIG. 2B) of the second protruding portion 18b in the second direction is equal to or more than 0.1 mm and equal to or less than 1 mm, for example.

The length of the first protruding portion 18a in the third direction is equal to or more than 0.1 mm and equal to or less than 5 mm, for example. In addition, the length of the second protruding portion 18b in the third direction is equal to or more than 0.1 mm and equal to or less than 5 mm, for example.

The distance (d3 in FIG. 2C) between the top surface tf and the bottom surface bf is equal to or more than 1 mm, for example. In other words, the thickness of the sealing resin 18 is equal to or more than 1 mm.

The length of the first protruding portion 18a in the first direction is equal to or more than 0.05 mm and equal to or less than 2 mm, for example. In addition, the length of the second protruding portion 18b in the first direction is equal to or more than 0.05 mm and equal to or less than 2 mm, for example.

Next, an example of a method of manufacturing the semiconductor device of the first embodiment will be described.

The semiconductor package 100 of the first embodiment is manufactured by using a transfer molding method.

FIGS. 3 to 9 are schematic cross-sectional views showing an example of the method of manufacturing the semiconductor device of the first embodiment. FIGS. 3, 5, 6, 8, and 9 are cross-sectional views parallel to the flow direction of the resin. FIGS. 4A, 4B, 7A, and 7B are cross-sectional views perpendicular to the flow direction of the resin. FIG. 4A is a cross-sectional view taken along the line FF' of FIG. 3. FIG. 4B is a cross-sectional view taken along the line GG' of FIG. 3. FIG. 7A is a cross-sectional view taken along the line HH' of FIG. 6. FIG. 7B is a cross-sectional view taken along the line II' of FIG. 6.

Figure 3:
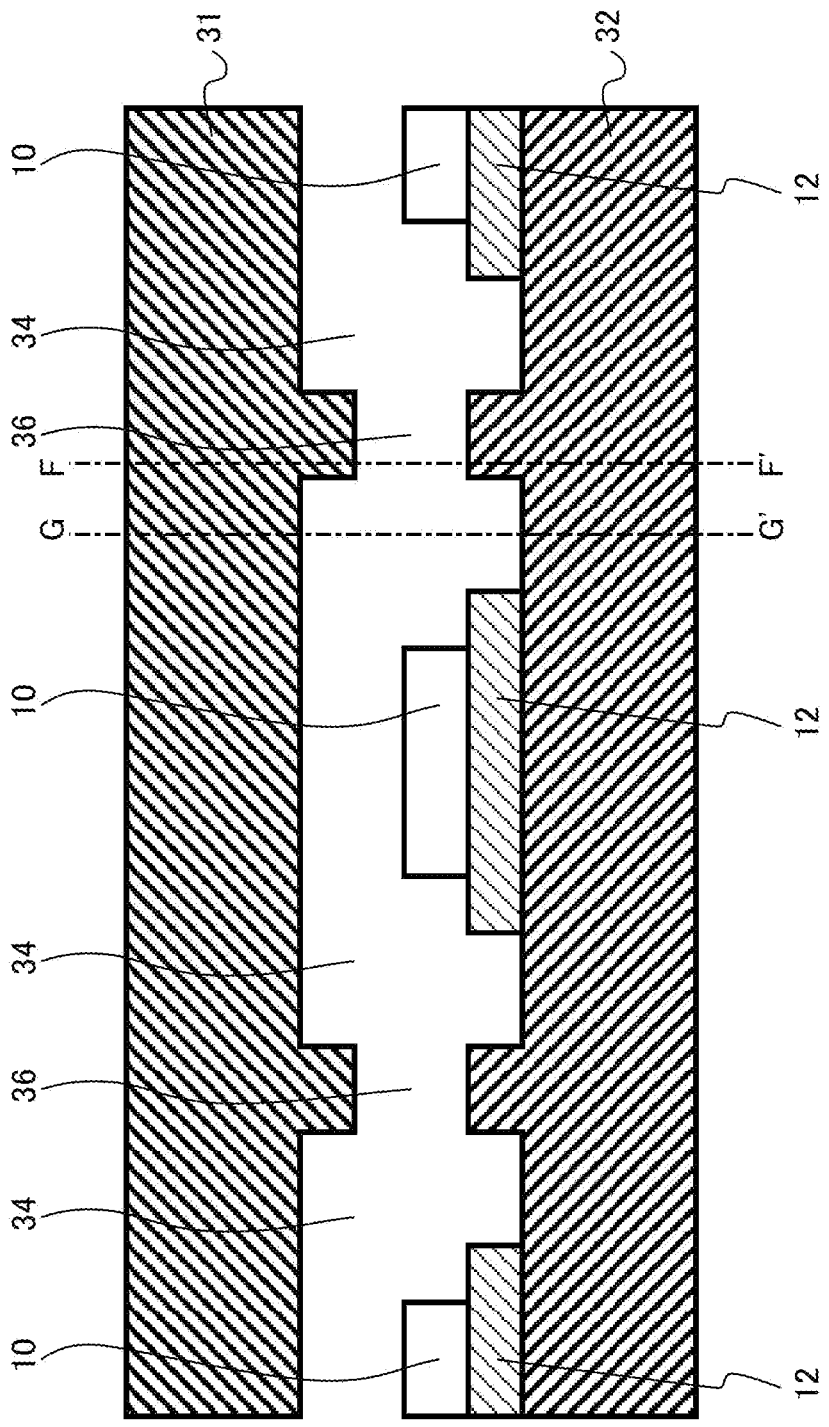
FIG. 3 is a schematic cross-sectional view showing an example of a method of manufacturing the semiconductor device of the first embodiment.

First, a lead frame including a plurality of die pads 12 to which the semiconductor chip 10 is fixed is interposed by a mold formed by an upper mold 31 and a lower mold 32. The lead frame including a plurality of die pads 12 to which the semiconductor chip 10 is fixed is interposed between the upper mold 31 and the lower mold 32 (FIG. 3). In FIGS. 3 to 9, the lead frame of portions other than the die pads 12 is not shown.

Figures 4A, 4B:
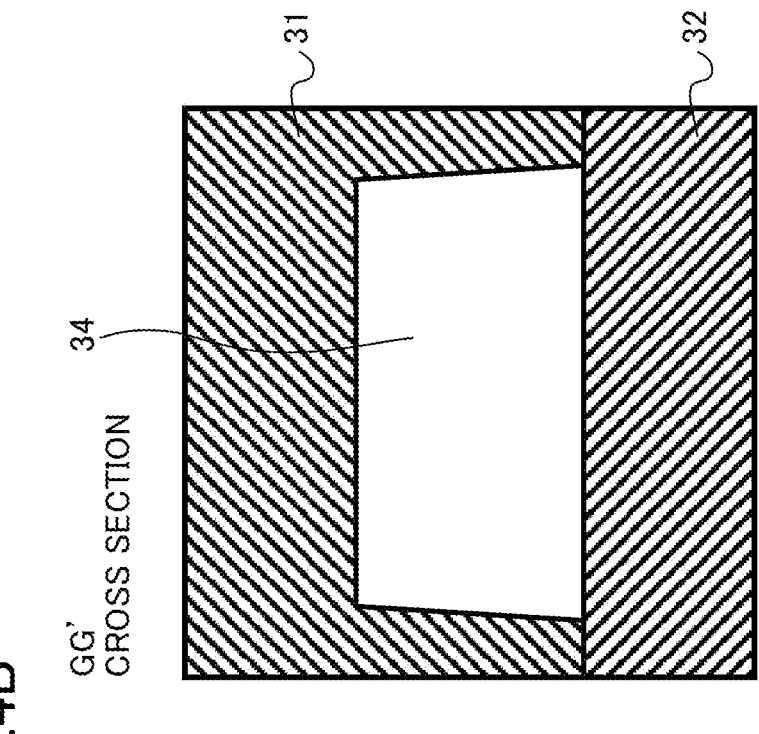
FIGS. 4A and 4B are schematic cross-sectional views showing an example of the method of manufacturing the semiconductor device of the first embodiment.

By combining the upper mold 31 and the lower mold 32, a plurality of cavities 34 and a through gate 36 connecting the adjacent cavities 34 to each other are formed (FIGS. 4A and 4B). The die pad 12 to which the semiconductor chip 10 is fixed is disposed in the cavity 34.

FIG. 4A is a cross-sectional view including the through gate 36. FIG. 4B is a cross-sectional view including the cavity 34.

The cross-sectional area of the through gate 36 on the cross section perpendicular to the flow direction of the resin is equal to or more than 10% of the maximum cross-sectional area of the cavity 34 on the cross section perpendicular to the flow direction of the resin. For example, the area of the cross section of the cavity 34 shown in FIG. 4B is the maximum cross-sectional area of the cavity 34. For example, the area of the cross section of the through gate 36 shown in FIG. 4A is equal to or more than 10% and equal to or less than 50% of the area of the cross section of the cavity 34 shown in FIG. 4B.

The maximum cross-sectional area of the cavity 34 is equal to or more than 6 mm$^2$.

Figure 5:
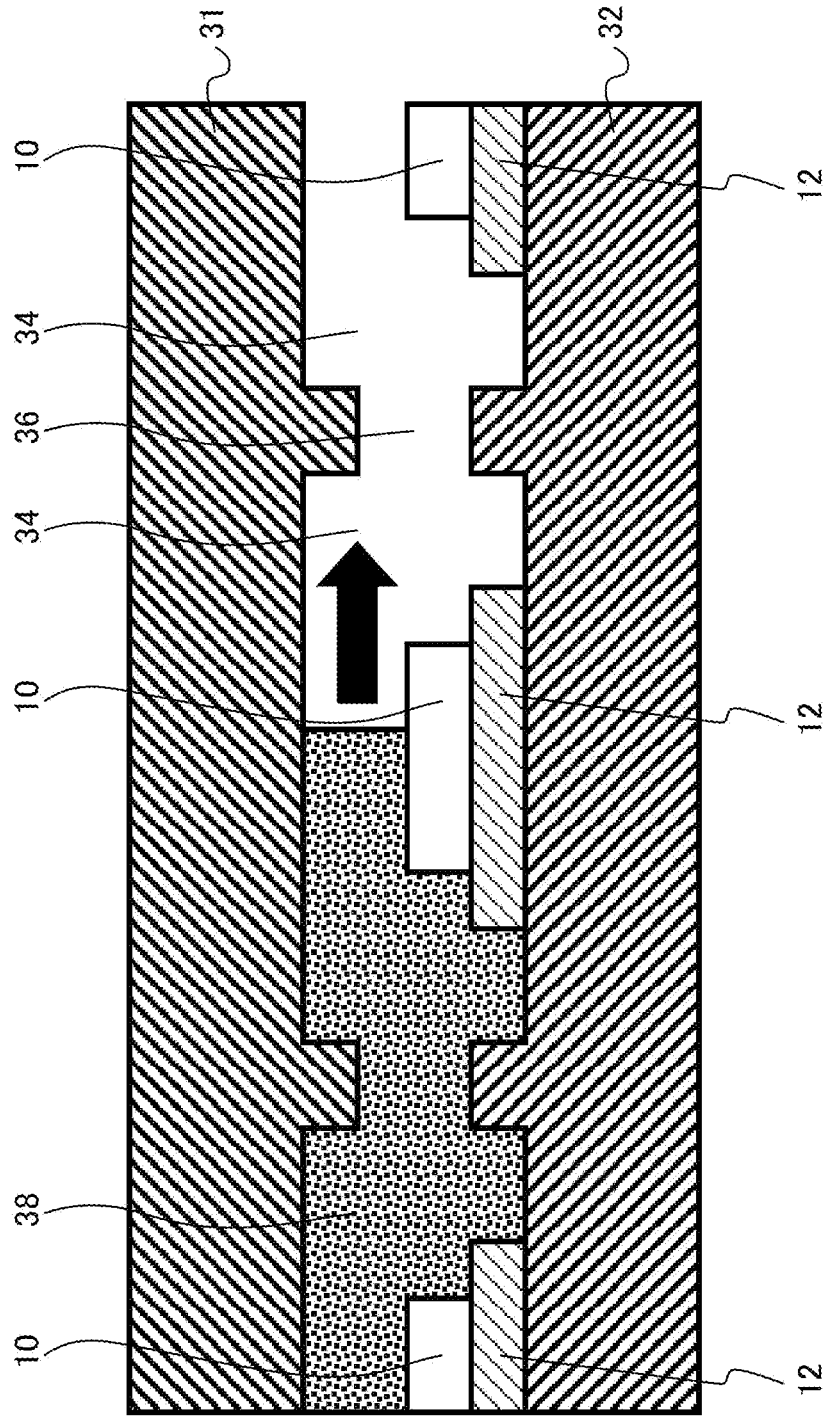
FIG. 5 is a schematic cross-sectional view showing an example of the method of manufacturing the semiconductor device of the first embodiment.

Then, a molten resin 38 is filled in the cavity 34 from a plunger (not shown) (FIG. 5). The resin 38 flows between the cavities 34 through the through gate 36. The resin 38 is, for example, an epoxy resin.

Figure 6:
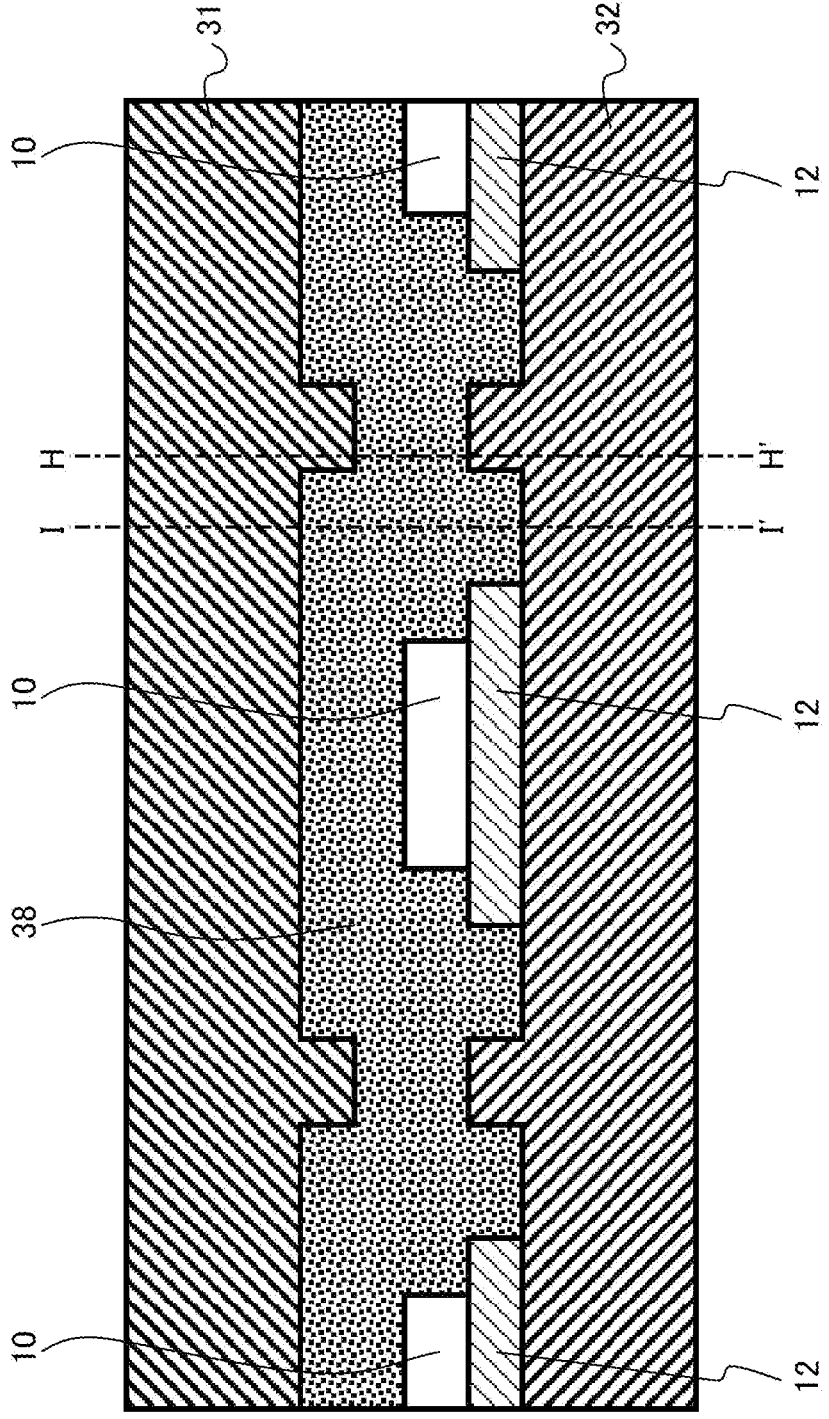
FIG. 6 is a schematic cross-sectional view showing an example of the method of manufacturing the semiconductor device of the first embodiment.
Figure 7A:
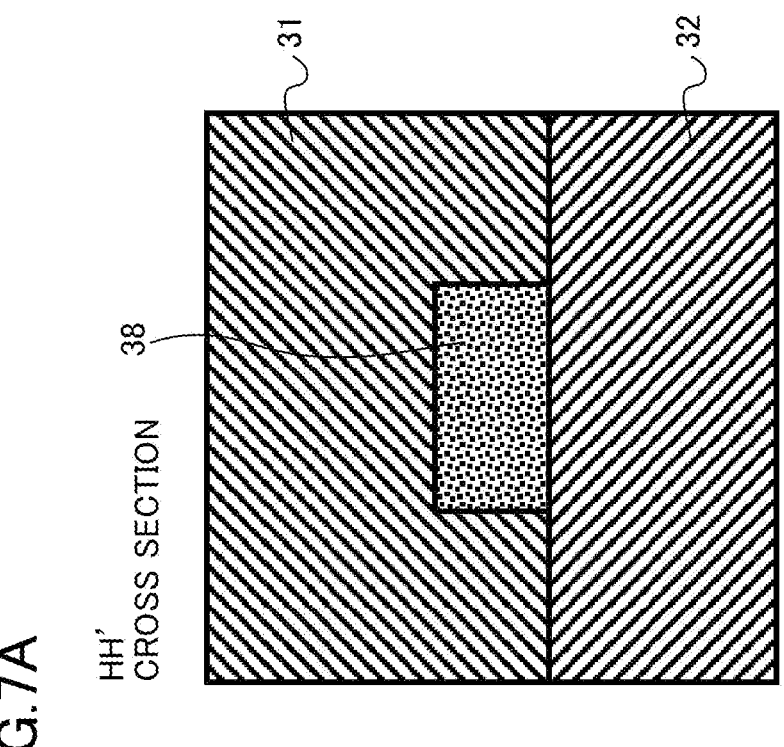
FIGS. 7A and 7B are schematic cross-sectional views showing an example of the method of manufacturing the semiconductor device of the first embodiment.
Figure 7B:
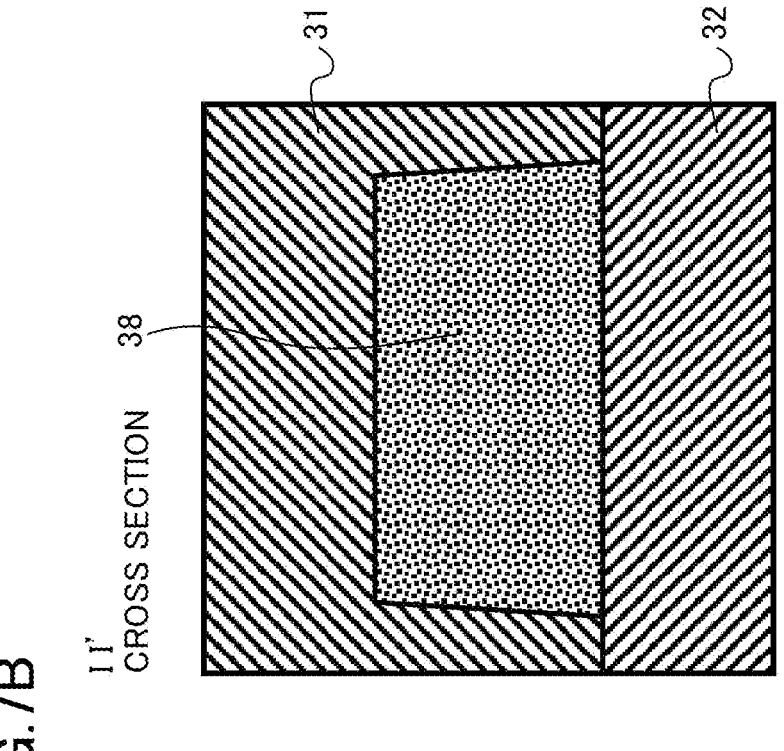

After all the cavities 34 are filled with the resin 38, the resin 38 is cooled and cured (FIGS. 6, 7A, and 7B). As shown in FIG. 7A, the cured resin 38 remains in the through gate. A part of the resin 38 remaining in the through gate becomes the first protruding portion 18a and the second protruding portion 18b of the semiconductor package 100. The resin 38 filled in the cavity 34 shown in FIG. 7B becomes the sealing resin 18 of the semiconductor package 100.

Figure 8:
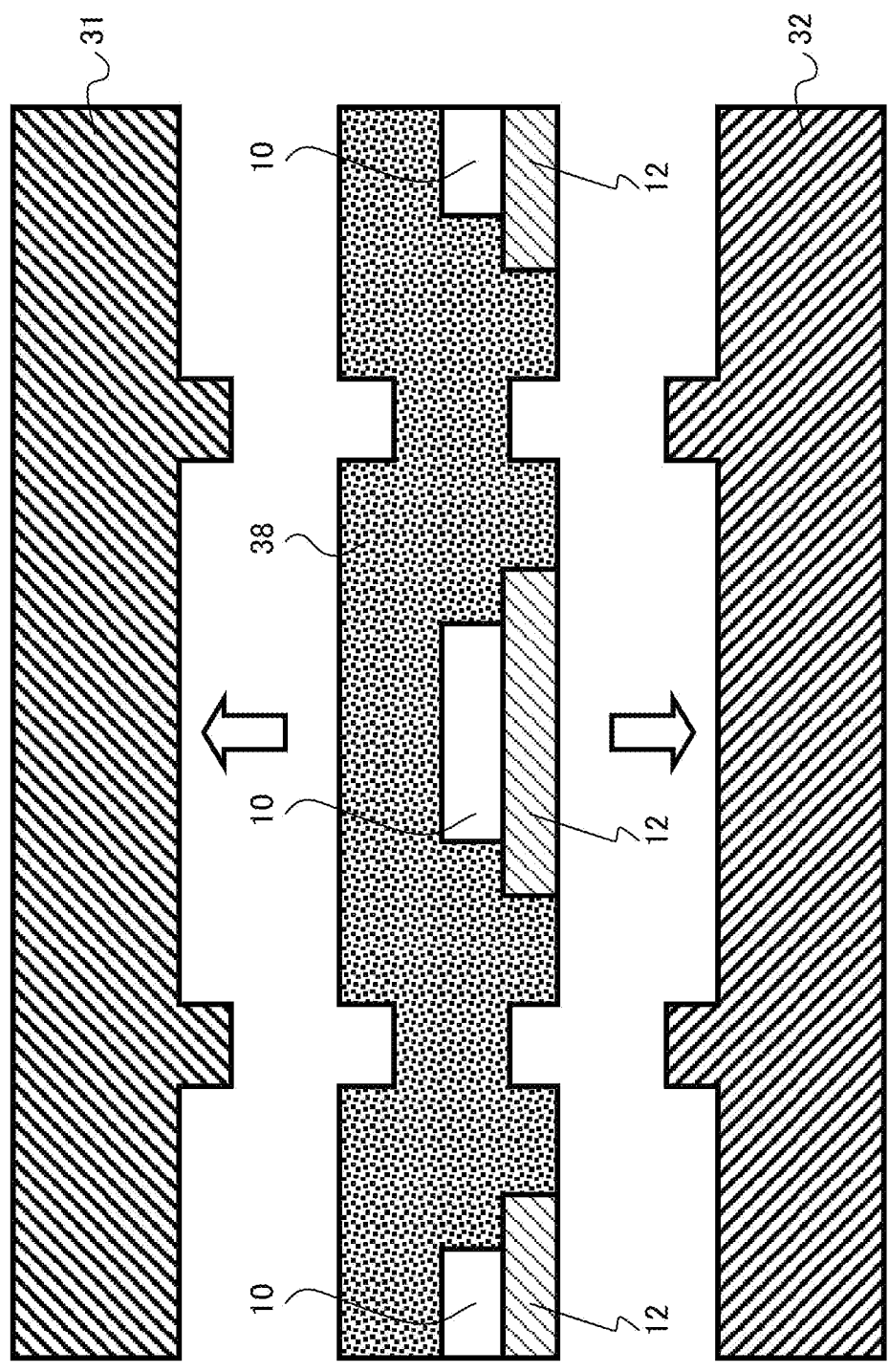
FIG. 8 is a schematic cross-sectional view showing an example of the method of manufacturing the semiconductor device of the first embodiment.

Then, the upper mold 31 and the lower mold 32 are separated from the cured resin 38 (FIG. 8).

Figure 9:
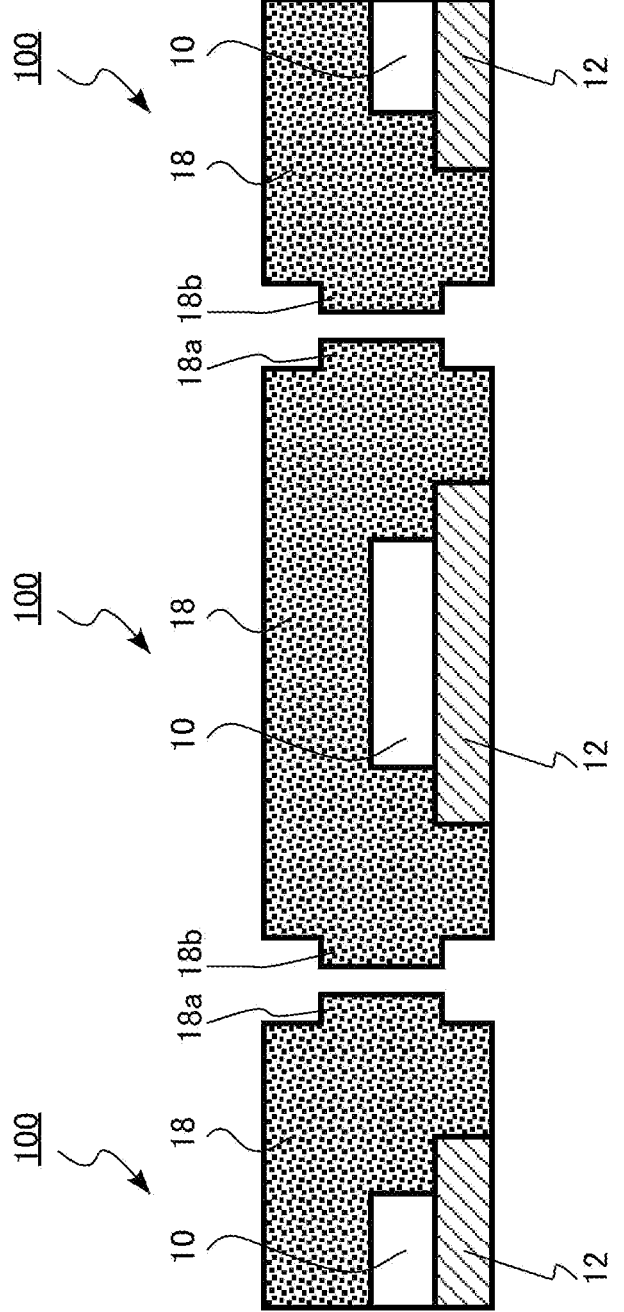
FIG. 9 is a schematic cross-sectional view showing an example of the method of manufacturing the semiconductor device of the first embodiment.

Then, the resin 38 remaining in the through gate is cut by the laser beam (FIG. 9). By cutting the resin 38 remaining in the through gate, the first protruding portion 18a and the second protruding portion 18b are formed.

By the manufacturing method described above, a plurality of semiconductor packages 100 according to the first embodiment are formed.

Next, the function and effect of the semiconductor device of the first embodiment will be described.

Figures 10A, 10B, 10C:
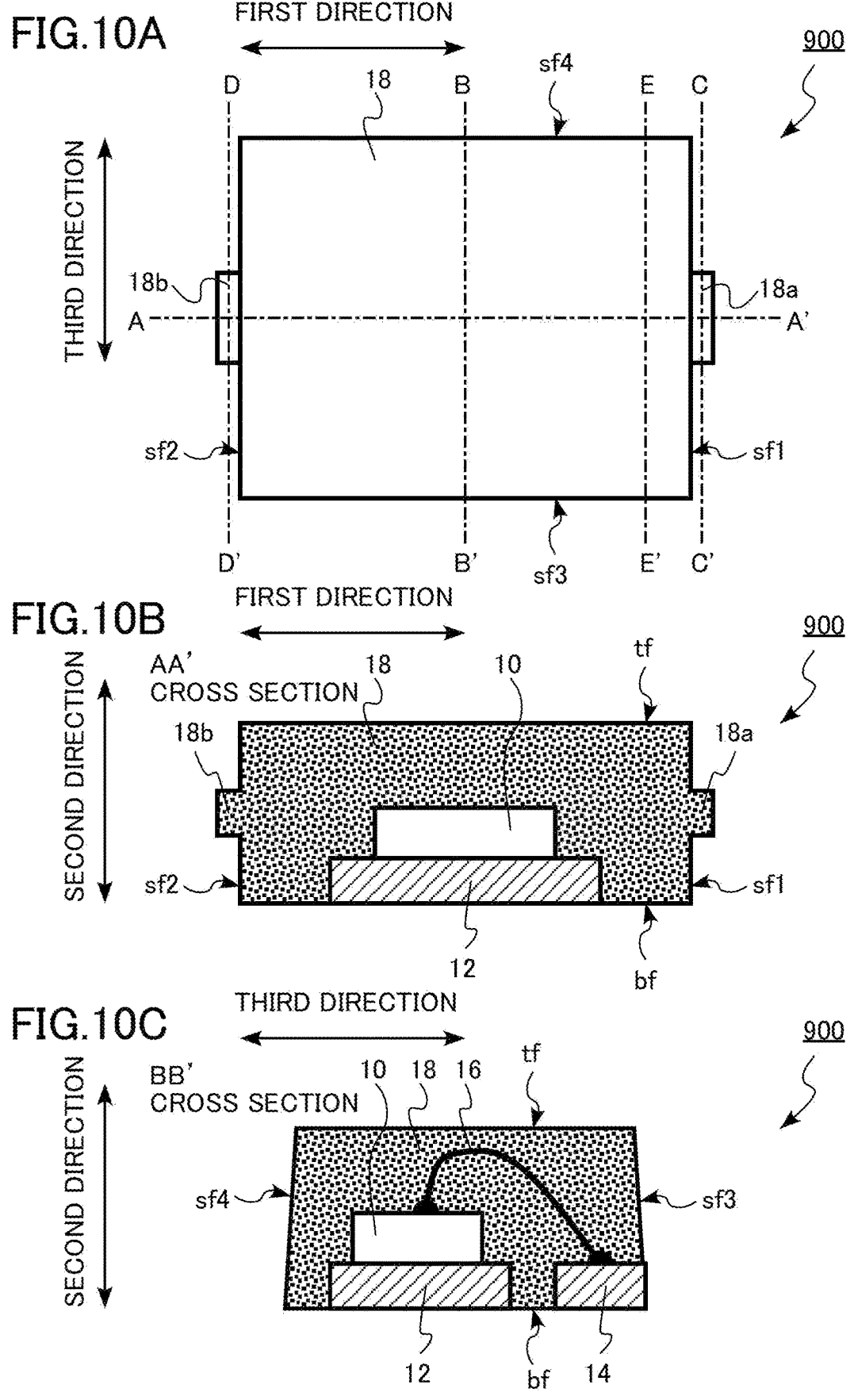
FIGS. 10A, 10B, and 10C are schematic diagrams of a comparative example of the semiconductor device of the first embodiment.

FIGS. 10A, 10B, and 10C are schematic diagrams of a comparative example of the semiconductor device of the first embodiment. FIG. 10A is a top view. FIG. 10B is a cross-sectional view. FIG. 10B is a cross-sectional view taken along the line AA' of FIG. 10A. FIG. 10C is a cross-sectional view. FIG. 10C is a cross-sectional view taken along the line BB' of FIG. 10A.

FIGS. 10A, 10B, and 10C are diagrams corresponding to FIGS. 1A, 1B, and 1C of the semiconductor device of the first embodiment.

FIGS. 11A, 11B, and 11C are schematic cross-sectional views of a comparative example of the semiconductor device of the first embodiment. FIG. 11A is a cross-sectional view taken along the line CC' of FIG. 10A. FIG. 11B is a cross-sectional view taken along the line DD' of FIG. 10A. FIG. 11C is a cross-sectional view taken along the line EE' of FIG. 10A.

FIGS. 11A, 11B, and 11C are diagrams corresponding to FIGS. 2A, 2B, and 2C of the semiconductor device of the first embodiment.

The comparative example of the semiconductor device of the first embodiment is a semiconductor package 900 in which a semiconductor chip is resin-sealed. The semiconductor package 900 includes the semiconductor chip 10, the die pad 12, the lead portion 14, the bonding wire 16, and the sealing resin 18.

The semiconductor package 900 of the comparative example is different from the semiconductor package 100 of the first embodiment in that the cross-sectional area of the first protruding portion 18a on the cross section perpendicular to the first direction is less than 10% of the maximum cross-sectional area of the sealing resin 18 on the cross section perpendicular to the first direction. For example, the area of the cross section of the sealing resin 18 shown in FIG. 11C is the maximum cross-sectional area of the sealing resin 18. For example, the area of the cross section of the first protruding portion 18a shown in FIG. 11A is less than 10% of the area of the cross section of the sealing resin 18 shown in FIG. 11C.

In addition, the semiconductor package 900 of the comparative example is different from the semiconductor package 100 of the first embodiment in that the cross-sectional area of the second protruding portion 18b on the cross section perpendicular to the first direction is less than 10% of the maximum cross-sectional area of the sealing resin 18 on the cross section perpendicular to the first direction. For example, the area of the cross section of the second protruding portion 18b shown in FIG. 11B is less than 10% of the area of the cross section of the sealing resin 18 shown in FIG. 11C.

In the manufacturing method of the comparative example of the semiconductor device of the first embodiment, the shapes of portions of the upper mold 31 and the lower mold 32 forming the through gate are different from those in the manufacturing method of the semiconductor device of the first embodiment.

Figures 12A, 12B:
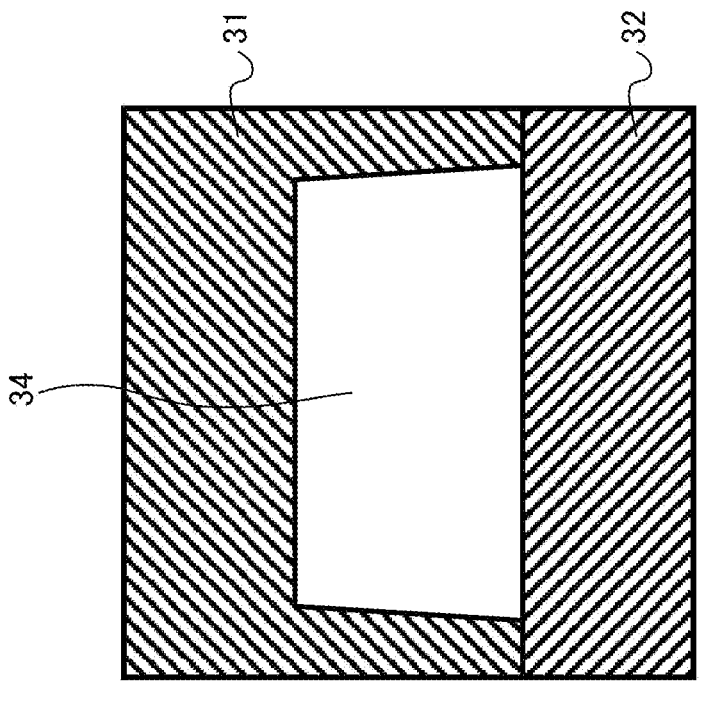
FIGS. 12A and 12B are schematic cross-sectional views showing an example of a manufacturing method of the comparative example of the semiconductor device of the first embodiment.
Figure 13:
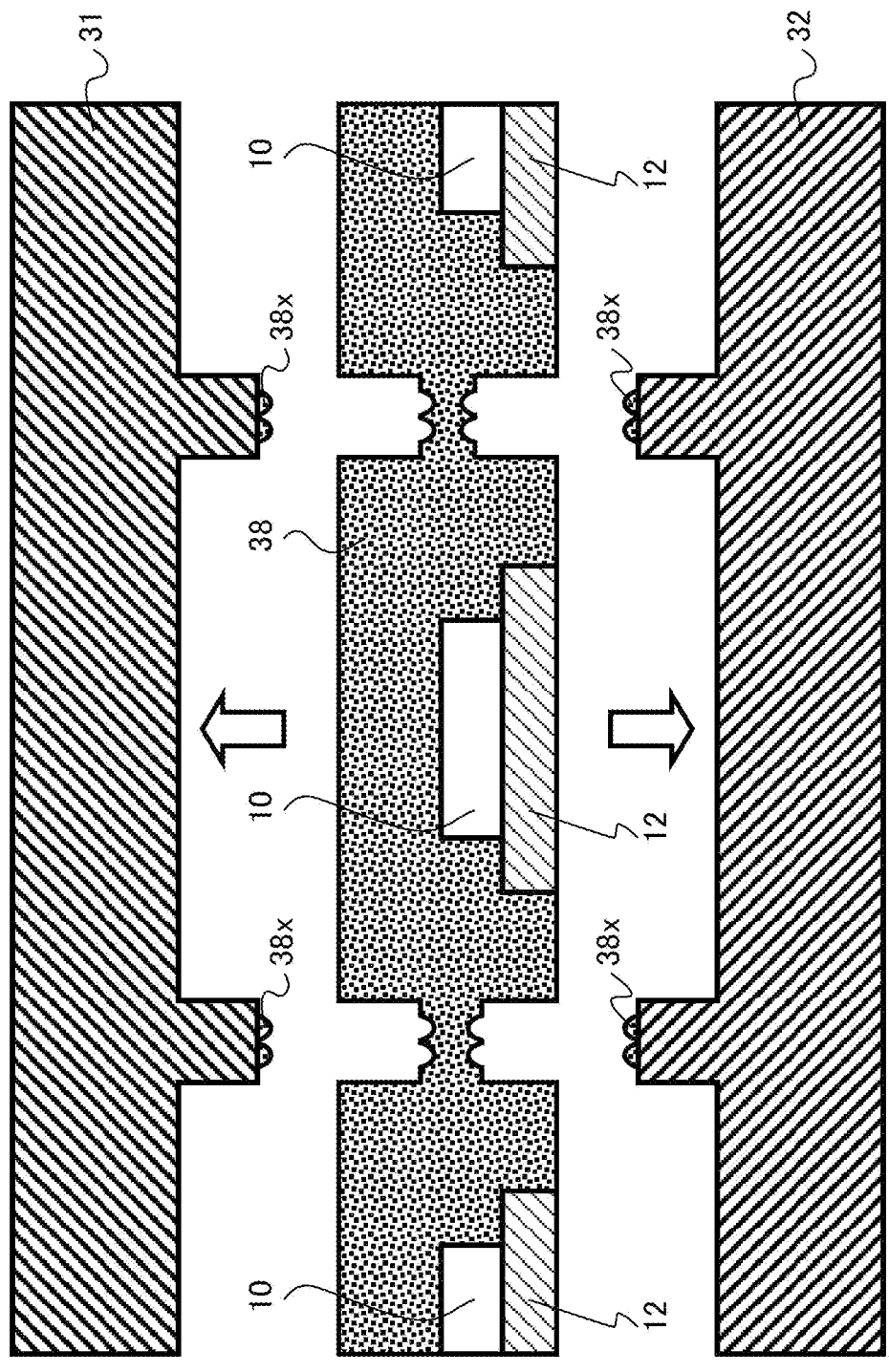
FIG. 13 is a schematic cross-sectional view showing an example of the manufacturing method of the comparative example of the semiconductor device of the first embodiment.

FIGS. 12A, 12B, and 13 are schematic cross-sectional views showing an example of the manufacturing method of the comparative example of the semiconductor device of the first embodiment. FIGS. 12A and 12B are cross-sectional views perpendicular to the flow direction of the resin. FIG. 13 is a cross-sectional view parallel to the flow direction of the resin. FIGS. 12A and 12B are diagrams corresponding to FIGS. 4A and 4B of the method of manufacturing the semiconductor device of the first embodiment. In addition, FIG. 13 is a diagram corresponding to FIG. 8 of the method of manufacturing the semiconductor device of the first embodiment.

FIG. 12A is a cross-sectional view including the through gate 36. FIG. 12B is a cross-sectional view including the cavity 34.

The cross-sectional area of the through gate 36 on the cross section perpendicular to the flow direction of the resin is less than 10% of the maximum cross-sectional area of the cavity 34 on the cross section perpendicular to the flow direction of the resin. For example, the area of the cross section of the cavity 34 shown in FIG. 12B is the maximum cross-sectional area of the cavity 34. For example, the area of the cross section of the through gate 36 shown in FIG. 12A is less than 10% of the area of the cross section of the cavity 34 shown in FIG. 12B.

The maximum cross-sectional area of the cavity 34 is equal to or more than 6 mm$^2$.

As shown in FIG. 13, in the manufacturing method of the comparative example, when the upper mold 31 and the lower mold 32 are separated from the cured resin 38, a part 38x of the resin may stick to the portions of the upper mold 31 and the lower mold 32 that form the through gate.

If the part 38x of the resin sticks to the portions of the upper mold 31 and the lower mold 32 that form the through gate, for example, when the next semiconductor package 900 is continuously formed, the effective cross-sectional area of the through gate may be decreased to cause poor filling of the resin 38. Therefore, for example, the yield of the semiconductor package 900 is reduced, and the productivity of the semiconductor package 900 is reduced.

In addition, if the part 38x of the resin sticks to the portions of the upper mold 31 and the lower mold 32 that form the through gate, for example, before the next semiconductor package 900 is continuously formed, cleaning of the upper mold 31 and the lower mold 32 is required. Therefore, the productivity of the semiconductor package 900 is reduced.

It is considered that the sticking of the resin to the mold occurs because the resin is dehydrated and condensed and accordingly the mold and the resin are bonded by a strong covalent bond. An adhesion aid is added to the resin that fills the cavity, for example, in order to improve the adhesion to the lead frame or the like. When the resin is cured, the mold and the resin are bonded by hydrogen bonds due to the action of the adhesion aid, and accordingly, the adhesion between the mold and the resin is improved.

Conceivably, in the case of the manufacturing method of the comparative example, since the pressure or viscosity of the resin increases at the through gate, dehydration condensation of the resin occurs, and accordingly, the mold and the resin are bonded by a covalent bond stronger than the hydrogen bond and the resin sticks to the mold.

As a result of the study by the inventor, it has been clarified that the pressure and viscosity of the resin at the through gate depend on the ratio of the cross-sectional area of the through gate to the maximum cross-sectional area of the cavity. Then, it has been clarified that the pressure or viscosity of the resin at the through gate can be reduced by increasing the ratio of the cross-sectional area of the through gate to the maximum cross-sectional area of the cavity. Therefore, it has been clarified that, by increasing the above ratio, the dehydration condensation of the resin can be suppressed and accordingly the sticking of the resin to the mold at the through gate can be suppressed.

As a result of the study by the inventor, it has been clarified that the sticking of the resin to the mold at the through gate can be suppressed by setting the cross-sectional area of the through gate on the cross section perpendicular to the flow direction of the resin to be equal to or more than 10% of the maximum cross-sectional area of the cavity on the cross section perpendicular to the flow direction of the resin.

In the related art, the cross-sectional area of the through gate is optimized from the viewpoints of the filling speed of the cavity, the work efficiency of cutting the resin in the through gate portion by the laser beam, and the like. Now, it has been found that the cross-sectional area of the through gate needs to be optimized from the viewpoint of suppressing the sticking of the resin to the mold at the through gate.

In particular, when the maximum cross-sectional area of the cavity is equal to or more than 6 mm$^2$, the cross-sectional area of the through gate is less than 10% of the maximum cross-sectional area of the cavity in the known method for optimizing the cross-sectional area of the through gate.

In the semiconductor package 100 of the first embodiment, the cross-sectional area of the first protruding portion 18a on the cross section perpendicular to the first direction is equal to or more than 10% of the maximum cross-sectional area of the sealing resin 18 on the cross section perpendicular to the first direction. In addition, the cross-sectional area of the second protruding portion 18b on the cross section perpendicular to the first direction is equal to or more than 10% of the maximum cross-sectional area of the sealing resin 18 on the cross section perpendicular to the first direction.

The semiconductor package 100 is manufactured by using a mold in which the cross-sectional area of the through gate 36 on the cross section perpendicular to the flow direction of the resin 38 is equal to or more than 10% of the maximum cross-sectional area of the cavity 34 on the cross section perpendicular to the flow direction of the resin 38. Therefore, the sticking of the resin to the mold at the through gate when manufacturing the semiconductor package 100 is suppressed. As a result, the productivity of the semiconductor package 100 is improved.

In the semiconductor package 100, the distance (d3 in FIG. 2C) between the top surface tf and the bottom surface bf is preferably equal to or more than 1 mm. In other words, the thickness of the sealing resin 18 in the semiconductor package 100 is preferably equal to or more than 1 mm. The configuration of the semiconductor package 100 is particularly effective when the thickness of the sealing resin 18 is equal to or more than 1 mm and the maximum cross-sectional area of the sealing resin 18 is large.

From the viewpoint of suppressing the sticking of the resin to the mold at the through gate, the length (d1 in FIG. 2A) of the first protruding portion 18a in the second direction is preferably equal to or more than 0.1 mm, more preferably equal to or more than 0.2 mm. In addition, from the viewpoint of suppressing the sticking of the resin to the mold at the through gate, the length (d2 in FIG. 2B) of the second protruding portion 18b in the second direction is preferably equal to or more than 0.1 mm, more preferably equal to or more than 0.2 mm.

From the viewpoint of improving the work efficiency of cutting the resin in the through gate portion by the laser beam, the length (d1 in FIG. 2A) of the first protruding portion 18 a in the second direction is preferably equal to or less than 1 mm. In addition, from the viewpoint of improving the work efficiency of cutting the resin in the through gate portion by the laser beam, the length (d2 in FIG. 2B) of the second protruding portion 18 b in the second direction is preferably equal to or less than 1 mm.

The maximum cross-sectional area of the cavity 34 is preferably equal to or more than 4 mm$^2$, more preferably equal to or more than 6 mm$^2$, and even more preferably equal to or more than 10 mm$^2$.

As described above, according to the first embodiment, it is possible to realize a semiconductor package with improved productivity.

Second Embodiment

A semiconductor device of a second embodiment is different from the semiconductor device of the first embodiment in that the shape of at least one first protruding portion on the cross section perpendicular to the first direction is a trapezoidal shape having sides facing each other in the second direction as its top and bottom bases and the shape of at least one second protruding portion on the cross section perpendicular to the first direction is a trapezoidal shape having sides facing each other in the second direction as its top and bottom bases. Hereinafter, the description of a part of the content overlapping the first embodiment will be omitted.

Figures 14A, 14B, 14C:
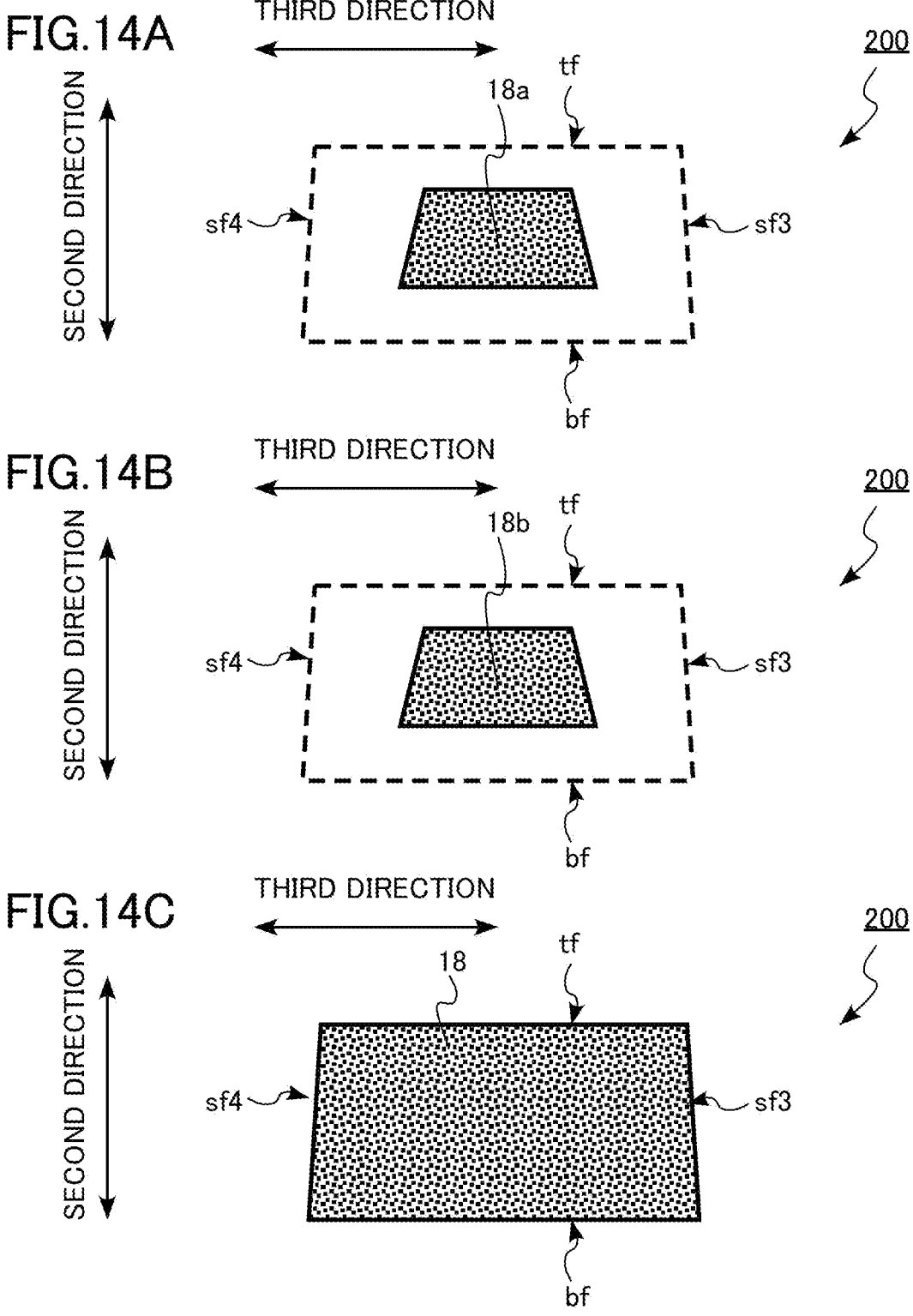
FIGS. 14A, 14B, and 14C are schematic cross-sectional views of a semiconductor device of a second embodiment.

FIGS. 14A, 14B, and 14C are schematic cross-sectional views of the semiconductor device of the second embodiment. FIGS. 14A, 14B, and 14C are diagrams corresponding to FIGS. 2A, 2B, and 2C of the semiconductor device of the first embodiment.

The semiconductor device of the second embodiment is a semiconductor package 200 in which a semiconductor chip is resin-sealed.

As shown in FIG. 14A, the shape of the first protruding portion 18a on the cross section perpendicular to the first direction is a trapezoidal shape having sides facing each other in the second direction as its top and bottom bases. In addition, as shown in FIG. 14B, the shape of the second protruding portion 18b on the cross section perpendicular to the first direction is a trapezoidal shape having sides facing each other in the second direction as its top and bottom bases.

Figures 15A, 15B:
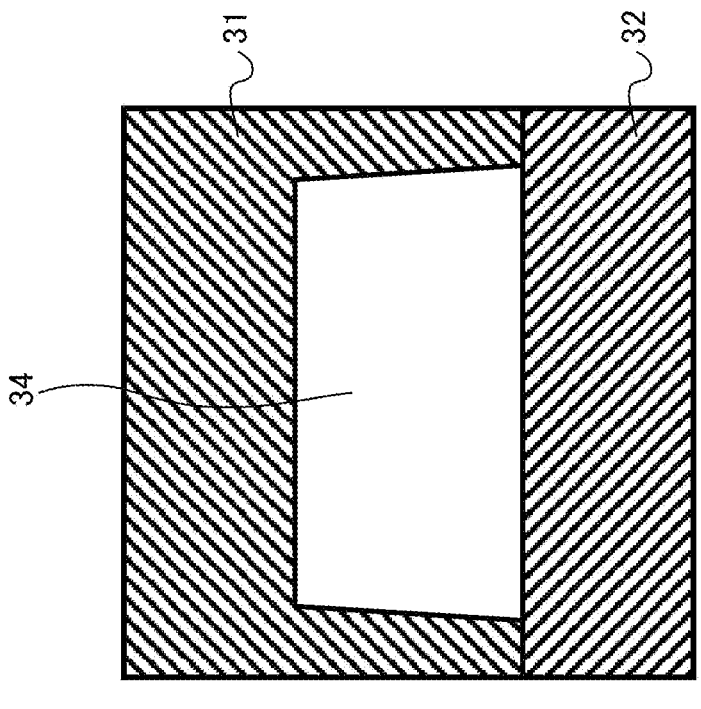
FIGS. 15A and 15B are schematic cross-sectional views showing an example of a method of manufacturing the semiconductor device of the second embodiment.

FIGS. 15A and 15B are schematic cross-sectional views showing an example of a method of manufacturing the semiconductor device of the second embodiment. FIGS. 15A and 15B are cross-sectional views perpendicular to the flow direction of the resin. FIGS. 15A and 15B are diagrams corresponding to FIGS. 4A and 4B of the method of manufacturing the semiconductor device of the first embodiment. FIG. 15A is a cross-sectional view including the through gate 36. FIG. 15B is a cross-sectional view including the cavity 34.

As shown in FIG. 15A, on the cross section including the through gate 36, the upper mold 31 has a tapered shape. The taper angle is equal to or more than 70° and equal to or less than 85°, for example.

When manufacturing the semiconductor package 200 of the second embodiment, the upper mold 31 has a tapered shape on the cross section including the through gate 36. Due to this shape, when the upper mold 31 is separated from the cured resin 38, the sticking of the resin to the mold is suppressed. Therefore, the productivity of the semiconductor package 200 is further improved as compared with the semiconductor package 100.

As described above, according to the second embodiment, it is possible to realize a semiconductor package with improved productivity.

Third Embodiment

A semiconductor device of a third embodiment is different from the semiconductor device of the first embodiment in that the sealing resin contains inorganic particles, the length of at least one first protruding portion in the second direction is equal to or more than twice the average particle diameter of the inorganic particles, and the length of at least one second protruding portion in the second direction is equal to or more than twice the average particle diameter of the inorganic particles. Hereinafter, the description of a part of the content overlapping the first embodiment will be omitted.

Figures 16A, 16B, 16C:
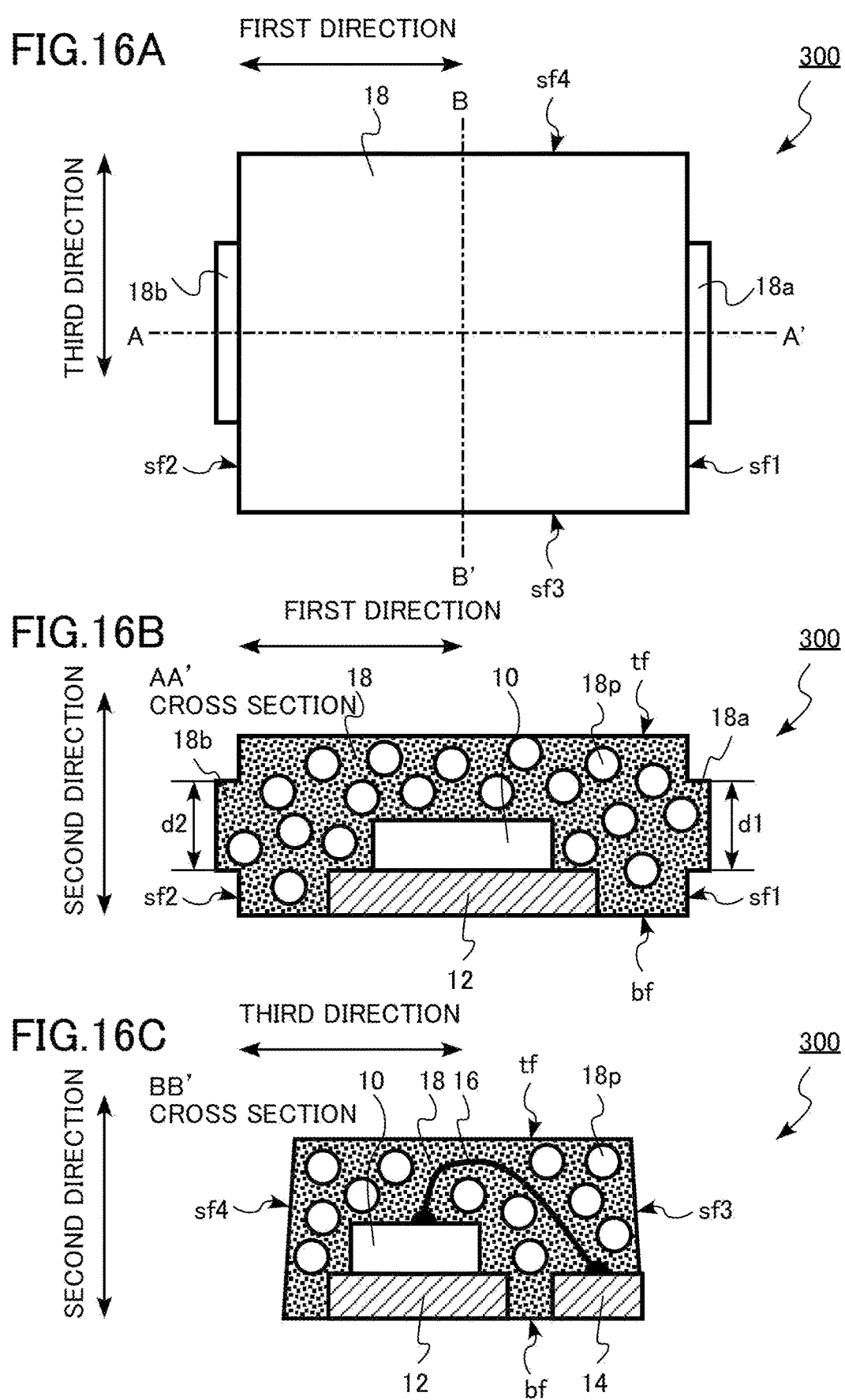
FIGS. 16A, 16B, and 16C are schematic diagrams of a semiconductor device of a third embodiment.

FIGS. 16A, 16B, and 16C are schematic diagrams of the semiconductor device of the third embodiment. FIG. 16A is a top view. FIG. 16B is a cross-sectional view. FIG. 16B is a cross-sectional view taken along the line AA' of FIG. 16A. FIG. 16C is a cross-sectional view. FIG. 16C is a cross-sectional view taken along the line BB' of FIG. 16A.

FIGS. 16A, 16B, and 16C are diagrams corresponding to FIGS. 1A, 1B, and 1C of the semiconductor device of the first embodiment.

The semiconductor device of the third embodiment is a semiconductor package 300 in which a semiconductor chip is resin-sealed. The semiconductor package 300 includes a semiconductor chip 10, a die pad 12, a lead portion 14, a bonding wire 16, and a sealing resin 18.

As shown in FIGS. 16B and 16C, the sealing resin 18 contains inorganic particles 18p. The inorganic particle 18p is a so-called filler.

The inorganic particle 18p has, for example, a function of reducing the difference in the coefficient of thermal expansion between the semiconductor chip 10 and the sealing resin 18 to suppress the generation of stress in the semiconductor package 300. By suppressing the generation of stress in the semiconductor package 300, for example, the occurrence of poor connection between the semiconductor chip 10 and the bonding wire 16 or the occurrence of poor connection between the lead portion 14 and the bonding wire 16 is suppressed. Therefore, the reliability of the semiconductor package 300 is improved.

The inorganic particle 18p is, for example, a silica particle. The average particle diameter of the inorganic particles 18p is equal to or more than 30 μm and equal to or less than 100 μm, for example. The particle diameter of the inorganic particle 18p is defined as the maximum diameter of the particles, for example. The average particle diameter of the inorganic particles 18p can be obtained, for example, by calculating the maximum diameter of each particle by image processing in a cross-sectional image of the sealing resin 18 obtained by SEM and calculating the average value thereof.

For example, if the size of the through gate is smaller than the particle diameter of each inorganic particle, it is difficult for the inorganic particles to flow through the through gate when manufacturing a semiconductor package. Therefore, the pressure or viscosity of the resin at the through gate may increase to cause the sticking of the resin to the mold at the through gate.

In the semiconductor package 300 of the third embodiment, the length (d1 in FIG. 16B) of the first protruding portion 18a in the second direction is equal to or more than twice the average particle diameter of the inorganic particles. In addition, the length (d2 in FIG. 16B) of the second protruding portion 18b in the second direction is equal to or more than twice the average particle diameter of the inorganic particles.

Therefore, it is possible to suppress an increase in the pressure or viscosity of the resin at the through gate when manufacturing the semiconductor package 300. As a result, the productivity of the semiconductor package 300 is improved.

From the viewpoint of suppressing an increase in the pressure or viscosity of the resin at the through gate, it is more preferable that the length (d1 in FIG. 16B) of the first protruding portion 18a in the second direction is equal to or more than three times the average particle diameter of the inorganic particles. In addition, it is more preferable that the length (d2 in FIG. 16B) of the second protruding portion 18b in the second direction is equal to or more than three times the average particle diameter of the inorganic particles.

From the viewpoint of suppressing an increase in the pressure or viscosity of the resin at the through gate, it is preferable that the length of the first protruding portion 18*a* in the third direction is equal to or more than twice the average particle diameter of the inorganic particles. In addition, it is preferable that the length of the second protruding portion 18*b* in the third direction is equal to or more than twice the average particle diameter of the inorganic particles.

As described above, according to the third embodiment, it is possible to realize a semiconductor package with improved productivity.

Fourth Embodiment

A semiconductor device of a fourth embodiment is different from the semiconductor device of the first embodiment in that there are at least two first protruding portions and there are at least two second protruding portions. Hereinafter, the description of a part of the content overlapping the first embodiment will be omitted.

Figures 17A, 17B, 17C:
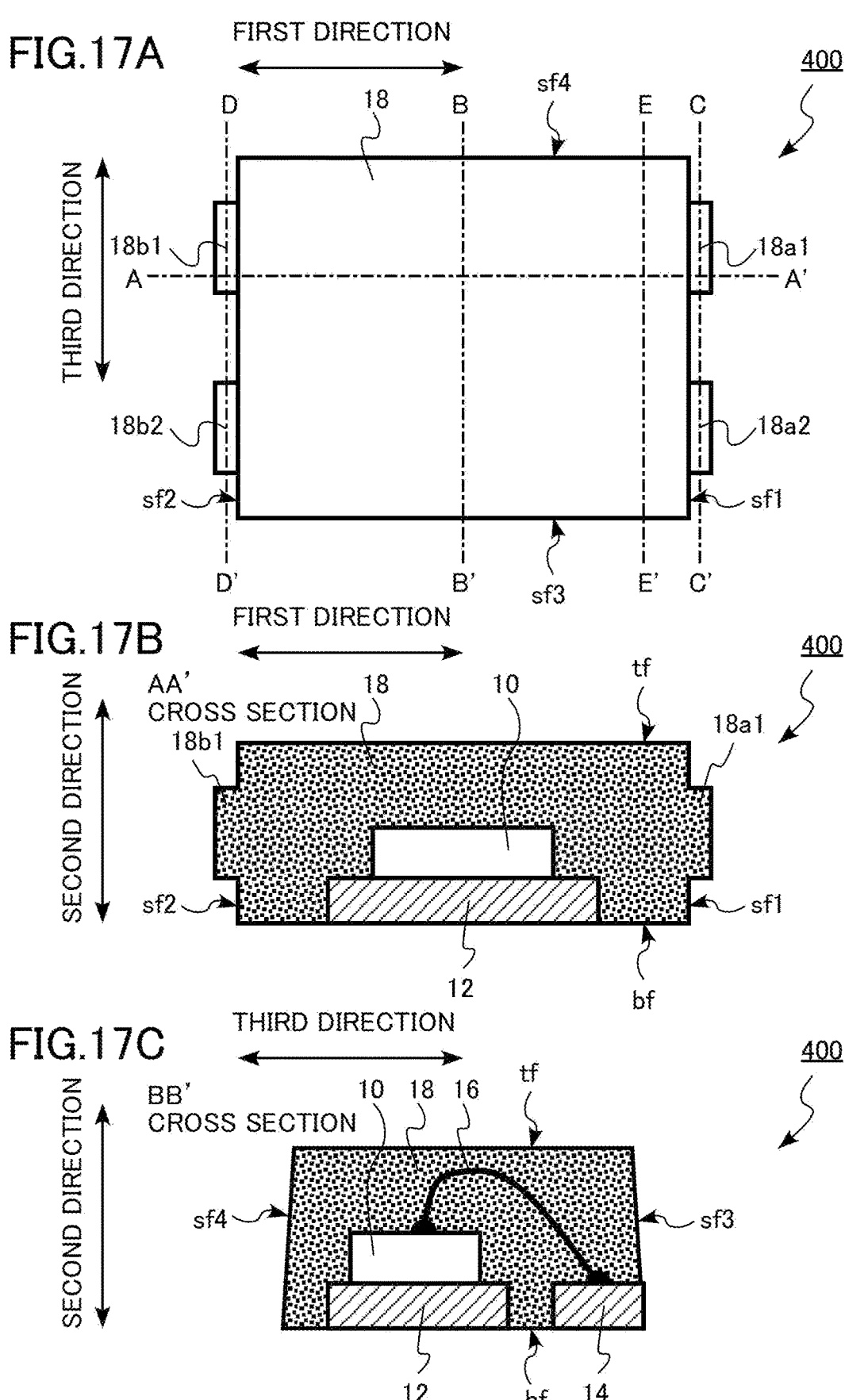
FIGS. 17A, 17B, and 17C are schematic diagrams of a semiconductor device of a fourth embodiment.

FIGS. 17A, 17B, and 17C are schematic diagrams of the semiconductor device of the fourth embodiment. FIG. 17A is a top view. FIG. 17B is a cross-sectional view. FIG. 17B is a cross-sectional view taken along the line AA' of FIG. 17A. FIG. 17C is a cross-sectional view. FIG. 17C is a cross-sectional view taken along the line BB' of FIG. 17A.

FIGS. 17A, 17B, and 17C are diagrams corresponding to FIGS. 1A, 1B, and 1C of the semiconductor device of the first embodiment.

FIGS. 18A, 18B, and 18C are schematic cross-sectional views of the semiconductor device of the fourth embodiment. FIG. 18A is a cross-sectional view taken along the line CC' of FIG. 17A. FIG. 18B is a cross-sectional view taken along the line DD' of FIG. 17A. FIG. 18C is a cross-sectional view taken along the line EE' of FIG. 17A.

FIGS. 18A, 18B, and 18C are diagrams corresponding to FIGS. 2A, 2B, and 2C of the semiconductor device of the first embodiment.

The semiconductor device of the fourth embodiment is a semiconductor package 400 in which a semiconductor chip is resin-sealed. The semiconductor package 400 includes a semiconductor chip 10, a die pad 12, a lead portion 14, a bonding wire 16, and a sealing resin 18.

The sealing resin 18 has a first protruding portion 18*a*1, a first protruding portion 18*a*2, a second protruding portion 18*b*1, and a second protruding portion 18*b*2.

On the first side surface sf1 of the sealing resin 18, two first protruding portions of the first protruding portion 18*a*1 and the first protruding portion 18*a*2 are provided. In addition, on the second side surface sf2 of the sealing resin 18, two second protruding portions of the second protruding portion 18*b*1 and the second protruding portion 18*b*2 are provided.

The sum of the cross-sectional area of the first protruding portion 18*a*1 and the cross-sectional area of the first protruding portion 18*a*2 on the cross section perpendicular to the first direction is equal to or more than 10% and equal to or less than 50% of the maximum cross-sectional area of the sealing resin 18 on the cross section perpendicular to the first direction. For example, the area of the cross section of the sealing resin 18 shown in FIG. 18C is the maximum cross-sectional area of the sealing resin 18. For example, the sum of the cross-sectional area of the first protruding portion 18*a*1 and the cross-sectional area of the first protruding portion 18*a*2 shown in FIG. 18A is equal to or more than 10% and equal to or less than 50% of the area of the cross section of the sealing resin 18 shown in FIG. 18C.

In addition, the sum of the cross-sectional area of the second protruding portion 18*b*1 and the cross-sectional area of the second protruding portion 18*b*2 on the cross section perpendicular to the first direction is equal to or more than 10% and equal to or less than 50% of the maximum cross-sectional area of the sealing resin 18 on the cross section perpendicular to the first direction. For example, the sum of the cross-sectional area of the second protruding portion 18*b*1 and the cross-sectional area of the second protruding portion 18*b*2 shown in FIG. 18B is equal to or more than 10% and equal to or less than 50% of the area of the cross section of the sealing resin 18 shown in FIG. 18C.

The maximum cross-sectional area of the sealing resin 18 is equal to or more than 6 mm$^2$.

In addition, the number of first protruding portions and the number of second protruding portions may be equal to or more than three. In addition, each of the first protruding portion and the second protruding portion may have a trapezoidal shape having sides facing each other in the second direction as its top and bottom bases.

The position of the first protruding portion and the position of the second protruding portion are, for example, plane-symmetrical with respect to a plane perpendicular to the first direction. By making the position of the through gate symmetrical, the flow of resin flowing through the cavity is stabilized, so that it is possible to fill the resin with less bias.

As described above, according to the fourth embodiment, it is possible to realize a semiconductor package with improved productivity.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a die pad;
   a semiconductor chip fixed on the die pad;
   a lead portion electrically connected to the semiconductor chip; and
   a sealing resin covering the semiconductor chip and at least a part of the die pad, the sealing resin including a first side surface, a second side surface, a bottom surface, and a top surface, the second side surface facing the first side surface in a first direction, the top surface facing the bottom surface in a second direction, the sealing resin including at least one first protruding portion provided on a side of the first side surface and at least one second protruding portion provided on a side of the second side surface, a cross-sectional area of the at least one first protruding portion on a cross section perpendicular to the first direction being equal to or more than 10% of a maximum cross-sectional area of the sealing resin on a cross section perpendicular to the first direction, a cross-sectional area of the at least one second protruding portion on a cross section perpendicular to the first direction being equal to or more than 10% of the maximum cross-sectional area, and the maximum cross-sectional area of the sealing resin being equal to or more than 6 mm$^2$, wherein the at least one first protruding portion and the at least one second protruding portion do not include the lead portion, the at least one first protruding portion and the at least one second protruding portion are not in contact with the lead portion, a bottom surface of the die pad is exposed at the bottom surface of the sealing resin, a bottom surface of the lead portion is exposed at the bottom surface of the sealing resin, and the bottom surface of the die pad and the bottom surface of the lead portion are substantially in a same plane.

2. The semiconductor device according to claim 1, wherein a distance between the top surface and the bottom surface is equal to or more than 1 mm.

3. The semiconductor device according to claim 1, wherein a length of the at least one first protruding portion in the second direction is equal to or more than 0.1 mm, and a length of the at least one second protruding portion in the second direction is equal to or more than 0.1 mm.

4. The semiconductor device according to claim 1, wherein a shape of the at least one first protruding portion on a cross section perpendicular to the first direction is a trapezoidal shape having sides facing each other in the second direction as its top and bottom bases, and a shape of the at least one second protruding portion on a cross section perpendicular to the first direction is a trapezoidal shape having sides facing each other in the second direction as its top and bottom bases.

5. The semiconductor device according to claim 1, wherein the sealing resin contains inorganic particles, a length of the at least one first protruding portion in the second direction is equal to or more than twice an average particle diameter of the inorganic particles, and a length of the at least one second protruding portion in the second direction is equal to or more than twice the average particle diameter of the inorganic particles.

6. The semiconductor device according to claim 5, wherein the inorganic particles are silica particles.

7. The semiconductor device according to claim 1, wherein number of the at least one first protruding portion is equal to or more than two, and number of the at least one second protruding portion is equal to or more than two.

8. The semiconductor device according to claim 1, wherein the sealing resin contains an epoxy resin.

9. The semiconductor device according to claim 2, wherein a length of the at least one first protruding portion in the second direction is equal to or more than 0.1 mm, and a length of the at least one second protruding portion in the second direction is equal to or more than 0.1 mm.

10. The semiconductor device according to claim 9, wherein a shape of the at least one first protruding portion on a cross section perpendicular to the first direction is a trapezoidal shape having sides facing each other in the second direction as its top and bottom bases, and a shape of the at least one second protruding portion on a cross section perpendicular to the first direction is a trapezoidal shape having sides facing each other in the second direction as its top and bottom bases.

11. The semiconductor device according to claim 1, wherein a length of the at least one first protruding portion in the second direction is larger than a distance between a top end of the at least one first protruding portion and the top surface of the sealing resin in the second direction, and the length of the at least one first protruding portion in the second direction is larger than a distance between a bottom end of the at least one first protruding portion and the bottom surface of the sealing resin in the second direction.

12. The semiconductor device according to claim 11, wherein a distance between a bottom end of the at least one first protruding portion and the bottom surface of the sealing resin in the second direction is smaller than a distance between a top surface of the semiconductor chip and the bottom surface of the sealing resin in the second direction.

* * * * *